(12) United States Patent
Zhang

(10) Patent No.: US 7,411,393 B2
(45) Date of Patent: Aug. 12, 2008

(54) METHOD AND SYSTEM FOR FIBER TRACKING

(75) Inventor: Wei Zhang, Singapore (SG)

(73) Assignee: Bracco Imaging S.p.A., Milan (IT)

( * ) Notice: Subject to any disclaimer, the term of this patent is extended or adjusted under 35 U.S.C. 154(b) by 50 days.

(21) Appl. No.: 11/336,376

(22) Filed: Jan. 20, 2006

(65) Prior Publication Data

US 2007/0124117 A1 May 31, 2007

Related U.S. Application Data

(60) Provisional application No. 60/741,356, filed on Nov. 30, 2005.

(51) Int. Cl.
*G01V 3/00* (2006.01)

(52) U.S. Cl. .................. 324/307; 324/309

(58) Field of Classification Search ......... 324/300–322; 600/407–445
See application file for complete search history.

(56) References Cited

U.S. PATENT DOCUMENTS

| | | | |
|---|---|---|---|
| 5,230,623 A | 7/1993 | Guthrie | |
| 5,539,310 A | 7/1996 | Baser | |
| 5,969,524 A * | 10/1999 | Pierpaoli et al. | 324/307 |
| 6,083,163 A | 7/2000 | Wegner | |
| 6,463,315 B1 | 10/2002 | Klingberg | |
| 6,526,305 B1 | 2/2003 | Mori | |
| 6,642,716 B1 | 11/2003 | Hoogenraad | |
| 6,806,705 B2 | 10/2004 | Van Muiswinkel | |
| 6,845,342 B1 | 1/2005 | Baser | |

(Continued)

FOREIGN PATENT DOCUMENTS

AU 2003224389 A1 12/2003

(Continued)

OTHER PUBLICATIONS

Mori, Susumu and Van Zijl, Peter C.M.; Fiber Tracking: Principles and Strategies—A Technical Review, *NMR Biomed.*, 2002, pp. 468-480, vol. 15, Published online in Wiley InterScience (www.interscience.wiley.com).

(Continued)

*Primary Examiner*—Brij Shrivastav
(74) *Attorney, Agent, or Firm*—M. Caragh Noone; Robert Day

(57) ABSTRACT

One embodiment of the present invention includes a system comprising to determine a direction of tracking a fiber based on a vector corresponding to a largest value of a set of values for a tensor, if an anisotropy value of the tensor is greater than or equal to a first threshold; and to apply a weighted function to the vector of the tensor to select the direction of tracking the fiber, if the anisotropy value of the tensor is less than or equal to the first threshold and larger than or equal to a second threshold. In one embodiment, the system is to generate the weighted function comprises a linear interpolation to be performed on the vector. In one embodiment, a weight of the linear interpolation is in part dependent on the anisotropy value of the tensor, wherein the weight corresponds to the anisotropy value relative to the first threshold. One embodiment of the invention is also executable as a method.

20 Claims, 15 Drawing Sheets
(10 of 15 Drawing Sheet(s) Filed in Color)

U.S. PATENT DOCUMENTS

| | | | |
|---|---|---|---|
| 6,853,189 | B1 | 2/2005 | Pipe |
| 6,859,203 | B2 | 2/2005 | Van Muiswinkel |
| 6,969,991 | B2 | 11/2005 | Bammer |
| 6,984,981 | B2 | 1/2006 | Tamez-Pena |
| 6,992,484 | B2 | 1/2006 | Frank |
| 2005/0101857 | A1 | 5/2005 | Masutani et al. |
| 2006/0269107 | A1* | 11/2006 | Wang et al. ............ 382/128 |

FOREIGN PATENT DOCUMENTS

| | | |
|---|---|---|
| AU | 2003230111 A1 | 12/2003 |
| EP | 1506425 | 11/2003 |
| EP | 1506426 | 11/2003 |
| EP | 1506427 | 11/2003 |
| WO | WO 01/38895 A1 | 5/2001 |
| WO | WO 03/098251 A1 | 11/2003 |
| WO | WO 03/098252 A1 | 11/2003 |
| WO | WO 03/098253 A1 | 11/2003 |
| WO | WO 2004/095052 A1 | 11/2004 |

OTHER PUBLICATIONS

Serra, Louis; Hern, Ng; Guan, Chua Gim; Lee, Eugene; Lee, Yen H.; T. T., Yeo; Chan, Chumpon; Kockro, Ralf A.; *An Interface for Precise and Comfortable 3D Work with Volumetric Medical Datasets*, 7 pages.

Serra, Louis; Poston, Timothy, Hern, Ng; Choon, Chua Beng; Waterworth, John A.; Interaction Techniques for a Virtual Workspace, *ACM Virtual Reality Software and Technology*, 1995, 11 pages, Chiba, Japan.

Shenton, Martha E.; Kubicki, Marek; and McCarley, Robert W.: *Diffusion Tensor Imaging—Image Acquisition and Processing Tools*, 2002, 10 pages total, Retrieved from online (http://splweb.bwh.harvard.edu:8000/pages/papers/pubs/yr2002.htm)

Poston, Tim; Serra, Luis; Lawton, Wayne; and Chua, Beng Choon; Interactive Tube Finding on a Virtual Workbench, *Second International Symposium on Medical Robotics and Computer Assisted Surgery*, Baltimore, Maryland, Nov. 4-7, 1995.

Serra, Luis; Hern, Ng; Choon, Chua beng; and Poston, Timothy; Interactive Vessel Tracing in Volume Data; *ACM, 1997 Symposium on Interactive 3D Graphics*, April 1997, Providence, RI, pp. 131-137.

Serra, Luis; Kockro, Ralf A.; Guan, Chua Gim; Hern, Ng; Lee, Eugene C.K.; Lee, Yen H.; Chan, Chumpon; and Nowinski, Wieslaw L; *Multimodal volume-based Tumor Neurosurgery Planning in the Virtual Workbench*.

Mori, Susumu and Van Zijl, Peter C.M.; Fiber Tracking: Principles and Strategies—A Technical Review, *NMR Biomed.*, 2002, pp. 468-480, vol. 15, Published online in Wiley InterScience (www.interscience.wiley.com).

Shenton, Martha E.; Kubicki, Marek; and McCarley, Robert W.; Diffusion Tensor Imaging—Image Acquistion and Processing Tools, 2002, 10 pages total, Retrieved from online (http://splweb.bwh.harvard.edu:8000/pages/papers/pubs/yr2002.htm).

* cited by examiner

METHOD AND SYSTEM FOR FIBER TRACKING

RELATED APPLICATIONS

The present application claims priority to the United States provisional application entitled Method and System for Fiber Tracking, filed on Nov. 30, 2005, assigned application number 60/741,356, which is incorporated in its entirety herein.

BACKGROUND

Diffusion Tensor Imaging (DTI) visualization is a growing field of research. The scanners are collecting better data all the time, and doctors and scientists are constantly discovering new applications for the data. The success of diffusion magnetic resonance imaging (MRI) is rooted in the powerful concept that during their random, diffusion-driven displacements, molecules probe tissue structure at a microscopic scale well beyond the usual image resolution. As diffusion is a three dimensional process, molecular mobility in tissues may be anisotropic, as in brain white matter.

The diffusion anisotropy effects can be extracted, characterized, and exploited, providing details on tissue microstructure. One such advanced application is that of fiber tracking in the brain, which may provide insight into the issue of connectivity. DTI has also been used to demonstrate subtle abnormalities in a variety of diseases (including stroke, multiple sclerosis, dyslexia, and schizophrenia) and is currently becoming part of many routine clinical protocols.

However, there exist a need for a more intuitive input interface to let the user specify the tracts of interest, so as to make them part of the surgical planning and subsequent navigation.

SUMMARY

One embodiment of the present invention includes a system comprising to determine a direction of tracking a fiber based on a vector corresponding to a largest value of a set of values for a tensor, if an anisotropy value of the tensor is greater than or equal to a first threshold; and to apply a weighted function to the vector of the tensor to select the direction of tracking the fiber, if the anisotropy value of the tensor is less than or equal to the first threshold and larger than or equal to a second threshold. In one embodiment, the system is to generate the weighted function comprises a linear interpolation to be performed on the vector. In one embodiment, a weight of the linear interpolation is in part dependent on the anisotropy value of the tensor, wherein the weight corresponds to the anisotropy value relative to the first threshold and the second threshold. One embodiment of the invention is also executable as a method.

BRIEF DESCRIPTION OF THE FIGURES

The patent or application file contains at least one drawing executed in color. Copies of this patent or patent application publication with color drawings will be provided by the Office upon request and payment of the necessary fee.

DETAILED DESCRIPTION

One embodiment of the invention includes a DTI module interface comprising of one or more sub-modules, namely, "Compute Tensor", "Visualization", "Fiber Track" and "Fiber Management". In alternative embodiments, a different set of sub-modules may be used. In one embodiment, the DTI module is operable with an input interface providing 3 degrees of spatial freedom to control input. The input interface, in effect, provides hand access inside a reference volume.

The compute tensor module is used to select the source DTI volume and the parameters with which to compute the tensors. The Visualization module provides a set of visualizations for the volumes, which may aid diagnosis. In an alternative embodiment, the source DTI volume can be loaded, the tensors automatically computed based on a predetermined set of parameters, and displayed via a predetermined visualization.

The Fiber Track module is used to track and visualize neuron fibers. In one embodiment, a ROI in the reference volume is specified as one or more 3D ROIs (e.g., a cube).

A Fiber Management module is also provided, in one embodiment, to organize fibers generated in the Fiber Track module. For example, the Fiber Management module allows the user to append, rename, or delete fibers. In one embodiment, a coloring tool is also supported to re-color the fibers and visually differentiate the various fibers.

Input Interface

Figure 1A:
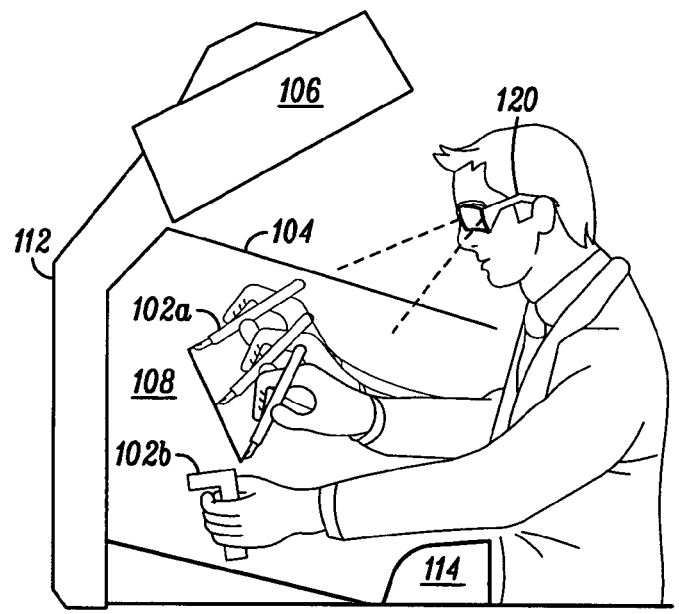
FIGS. 1a-b illustrate the input interface, in accordance with one embodiment.

As stated above, in one embodiment the DTI module is operable with an input interface providing at least 3 degrees of spatial freedom to control input (also referenced herein as the "input interface"). The input interface provides for 3D spatial interactive manipulations. FIG. 1 illustrates the input interface, in accordance with one embodiment. The input interface, in effect, provides hand access inside a reference volume.

By way of illustration, to work with 3D rendered objects or reference volumes, the input interface includes one or more handheld instruments 102a-b, such as a stylus. In one embodiment, the instruments allow the user to freely maneuver the instruments for 3 or more degrees of freedom. A corresponding image of a handheld instrument (also referenced herein as a "virtual tool"), along with its movements is displayed for interaction with a reference volume.

In one embodiment, maneuvering of a handheld device produces corresponding maneuvering of the displayed reference volume, which may be displayed as a 3D image. As a result, the reference can be rotated from different angles and moved in different directions. In one embodiment, a user activates the handheld device (e.g., presses a button on the handheld device 102b) to have movement of the handheld device produce movement of the displayed reference volume, including maneuvering a position and orientation of the volume.

The movement of the handheld instruments, in one embodiment, is tracked by a radio frequency (rf) tracker. In an alternative embodiment, the input interface may comprise a haptic device for providing input control with the one or more handheld devices.

In alternative embodiments, more than two handheld devices may be provided. For example, multiple users may be able to interact with the reference volume, remotely or locally. In one embodiment, a single handheld device may be used to perform a set of the activities described above.

In one embodiment, a mirror 103 is placed between the user and the computer screen 106. The mirror reflects the reference volume and the virtual tool as displayed by the computer screen. The user's hands are able to move in a workspace 108 behind the mirror and interact with the reference volume shown by the reflection. As a result, the user is able to work with the reference volume with both hands without obscuring the reference volume. In addition, in one embodiment, the input interface is provided with a workstation 112 that includes a support 114 for the user's arm to rest.

In one embodiment, the reference volume may be displayed on the screen stereoscopically. In one embodiment, liquid crystal display (LCD) shutter glasses 120 are used to perceive the reference volume stereoscopically. The LCD shutter glasses allow light through in synchronization with the images on the computer display, using the concept of Alternate-frame sequencing. Multiple viewers may wear shutter glasses to simultaneously view and discuss the reference volume.

Complex applications like neurosurgery planning typically require frequent access to buttons and sliders that control applications and activate modes of operation and tools. As such, one embodiment includes a virtual tool panel to provide an integration of the workspace having at least 3 degrees of spatial freedom and application control.

Figure 1B:
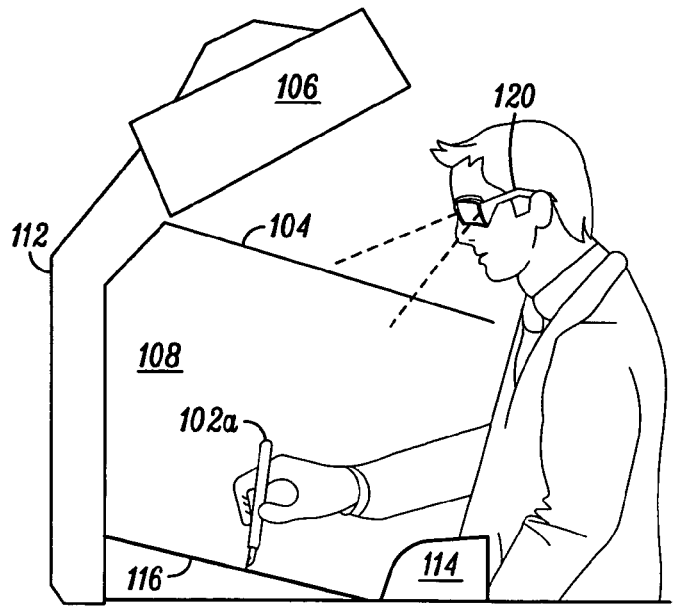

In one embodiment, as illustrated in FIG. 1b, the virtual tool panel coincides with a solid surface 116 beneath the workspace 108. In one embodiment, the virtual tool panel can be presented in response to touching the base 116 with a handheld tool 102a and disappears upon removing the tool away from the base. Interaction between the handheld tool and the virtual tool panel may include other actions including one or more of pushing buttons, dragging sliders, controlling curves and more.

In one embodiment, the input interface is operable with a process or module that is able to generate real-time volumetric and 3D spatial surface rendering of multimodal images based on one or more of computer tomography (CT), positron emission tomography (PET), single-photon emission computer tomography (SPECT), magnetic resonance imaging (MRI), magnetic resonance angiography imaging (MRA), volumetric ultrasound, and as well as segmentations obtained from one or more of the multimodal images. By using the input interface and the process together, in one embodiment a stereoscopic Virtual Reality (VR) environment is provided in which a user can work interactively in real-time with 3D data by "reaching into it" with both hands.

In one embodiment, the process comprises of one or more of the following features: perspective stereoscopic shaded volume and surface rendering; multimodality image fusion; automatic volume registration and verification of the registered objects; segmentation; surgical exploration tools for cropping, cutting, drilling, restoring, cloning, roaming, linear and volumetric measurement; color and/or transparency mapping with volume rendering preset; DICOM compliant, as well as supporting multiple file formats (e.g., TIFF); and capturing 3D spatial interactive manipulations, with stereoscopic playback and video export capabilities.

Diffusion Tensor Imaging (DTI) Module

As described above, in one embodiment, the DTI module comprises a set of sub-modules. They are the compute tensor module, visualization module, fiber track module and fiber management module. An alternative set of modules may be used without departing from the invention. For example, in one embodiment, the source DTI volume could be loaded and the tensors automatically computed based on a predetermined set of parameters, along with a predetermined visualization way pre-selected. In such an embodiment, the computation and/or the visualization modules may not be included in the DTI module for user interaction.

Compute Tensor Module

Figure 2:
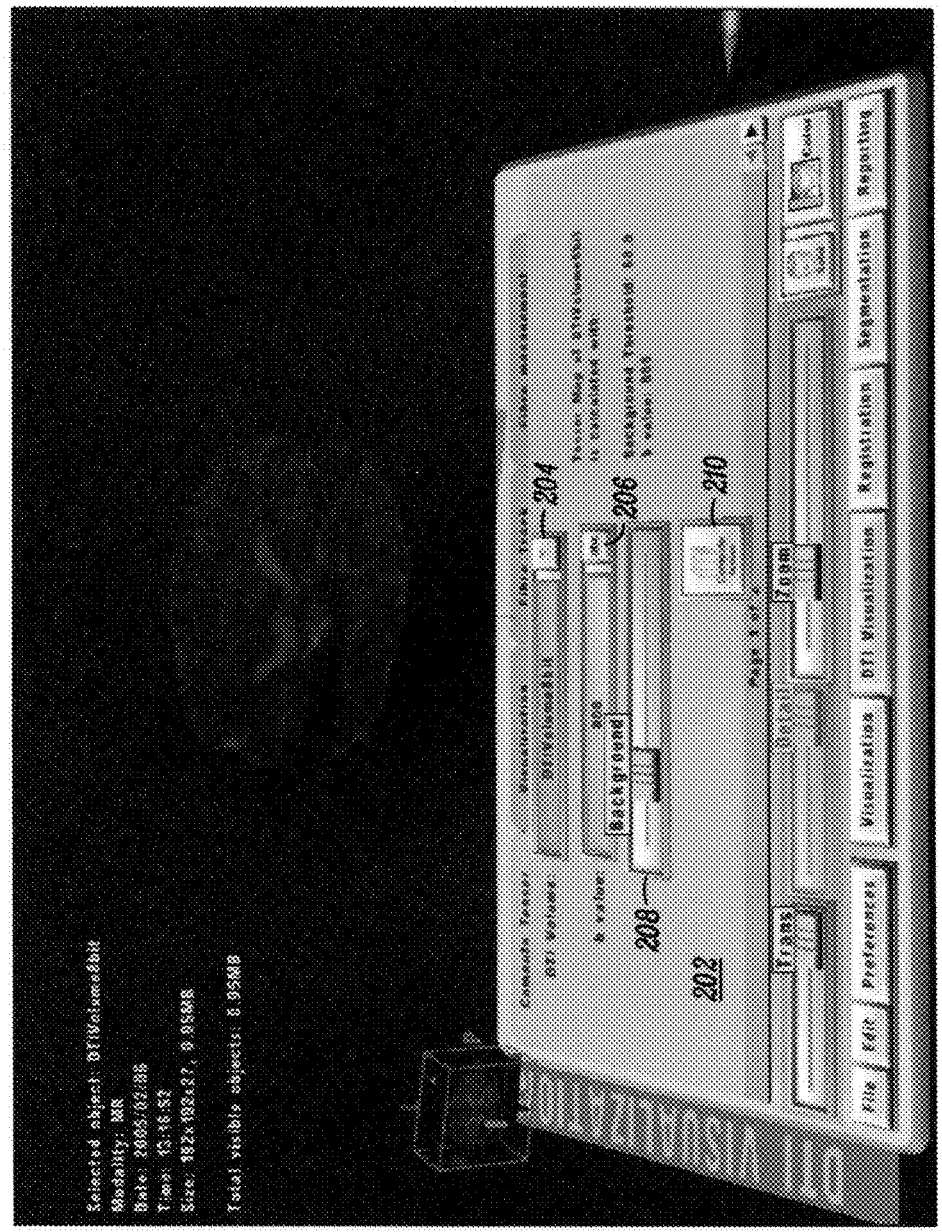
FIG. 2 further illustrates one embodiment of the compute tensor module.

FIG. 2 further illustrates one embodiment of the compute tensor module. The compute tensor module is to compute the diffusion tensors from the source DTI volume comprising a set of 6 or more Diffusion Weighted Images (DWIs). The panel 202 of the compute tensor module allows a user to choose the source DTI volume, the diffusion sensitization parameter (also called b value) and the intensity threshold of the DWIs.

The object selector 204 of the panel 202 is provided to select the source DTI volume. In one embodiment, the number selector 206 in the panel is provided to specify the b value that is determined during the DWIs acquisition process. The b value parameter is used to compute tensors.

The slider 208 on the panel 202 is to specify the intensity threshold of the source DTI volume. In one embodiment, for those voxels with intensities smaller than the intensity threshold, the tensors (3*3 matrixes) are not computed and are considered as the zero matrixes. In this way, the tensors of the background voxels need not be computed, thereby increasing the speed of the tensor computation process.

When the compute tensor button 210 is pressed, the tensors for the source DTI volume are computed. In one embodiment, the features 212 provided on the panel 202 summarize the parameters used to compute the tensors. In one embodiment, the features 212 appear only after the tensors are computed. In alternative embodiments, the components provided on the panel 202 of the compute tensor module may vary without departing from the invention.

Visualization Module

Figure 3:
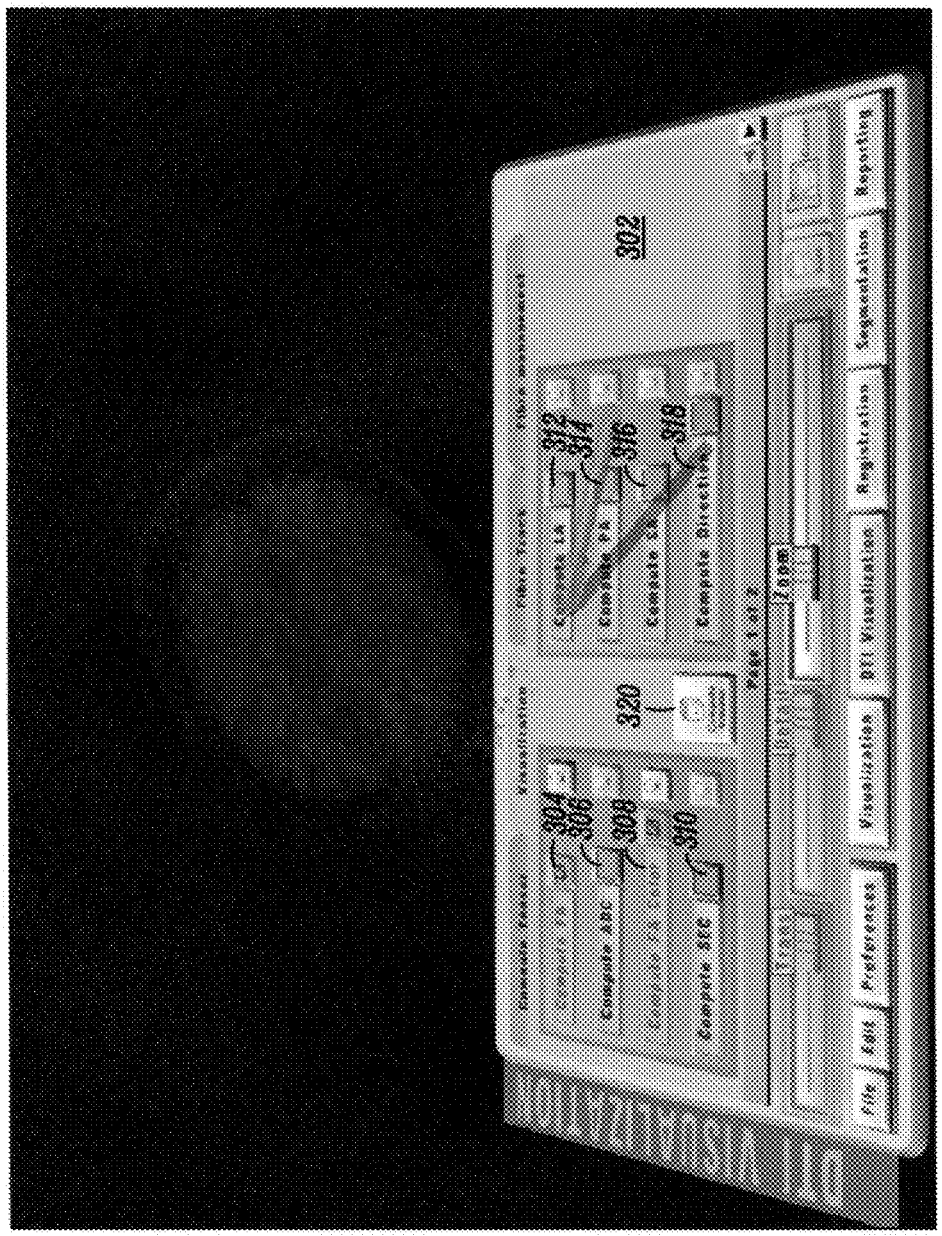
FIG. 3 illustrates one embodiment of the visualization module used to select a visualization of the computed tensors.
Figure 4A:
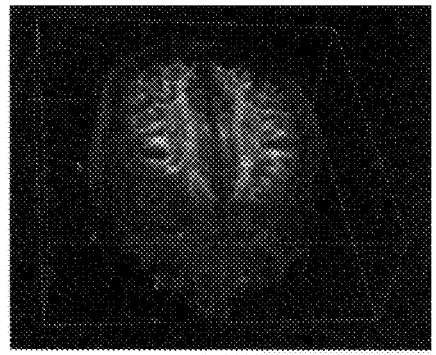
FIGS. 4a-h illustrate examples of a reference volume via different visualizations, in accordance with one embodiment.
Figure 4B:
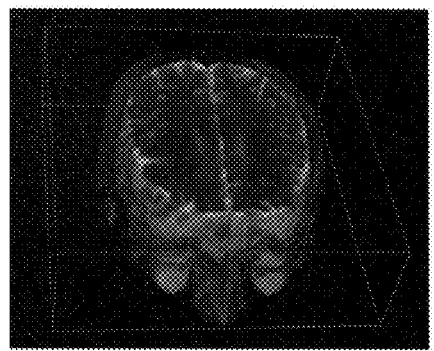
Figure 4C:
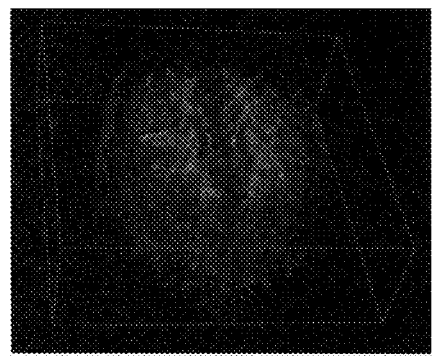
Figure 4D:
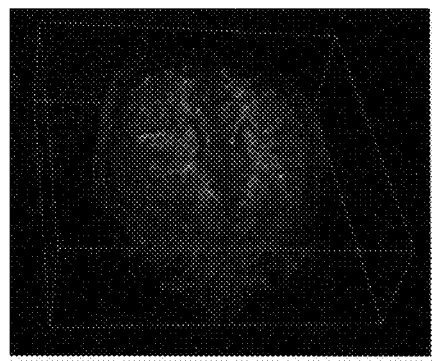
Figure 4E:
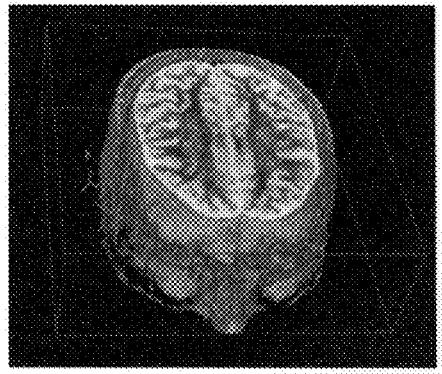
Figure 4F:
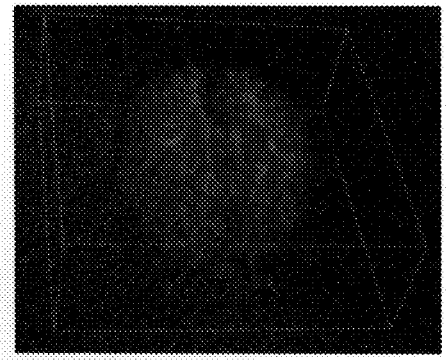
Figure 4G:
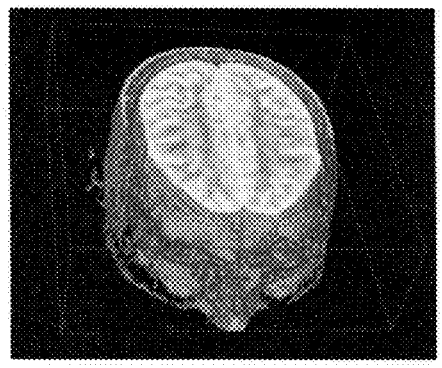
Figure 4H:
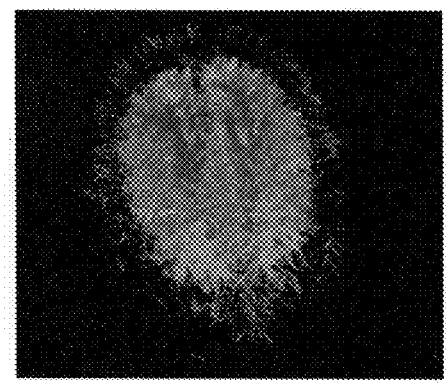

FIG. 3 illustrates one embodiment of the visualization module used to select a visualization of the computed tensors. In one embodiment, there are a set of visualizations on the panel 302 of the visualization module. In one embodiment, the visualizations include one or more of: FA (fractional anisotropy) volume 304, ADC (apparent diffusion coefficient) volume 306, FA color volume 308, SEC (shape encoded color) volume 310, LA (linear anisotropy) volume 312, PA (planar anisotropy) volume 314, SA (spherical anisotropy) volume 316 and Direction (largest diffusion direction) lines 318. An alternative set of visualizations may be used without departing from the invention. For example, one embodiment of the visualization model may not include FA.

In one embodiment, DTI tensors of the source DTI volume are rendered by selecting visualization on the panel and then pressing the "Compute Volume" button 320 on the panel.

The FA, ADC, LA, PA, SA volumes are the grayscale volumes that show the diffusion property of the DTI tensors. In FA volume, the voxel with higher intensity indicates that the diffusion of the tensors in this voxel is more anisotropic, as illustrated by way of example in FIG. 4(*a*). The ADC volume represents the mean diffusivity of the brain. The intensity of the voxel of ADC volume indicates the mean diffusion strength of DTI tensor in that voxel, as illustrated by way of example in FIG. 4(*b*). The LA, PA and SA volumes represent the linear, planar, spherical diffusion properties of the DTI tensors respectively, as shown in FIGS. 4(*d-f*). The higher intensity in a voxel in the LA, PA and SA volumes indicate the higher linear, planar and spherical diffusion of the tensor in this voxel.

In one embodiment, the FA color volume is the color-coded volume that shows the direction information of the tensors, as illustrated by way of example in FIG. 4(*f*). In one embodiment, the SEC volume provides color-coded volume encoding of the shape information of the DTI tensors, as illustrated by way of example in FIG. 4(*g*). The color of the voxel indicates shape of the diffusion tensor in this voxel. In the example of FIG. 4(*g*), the red color indicates that the diffusion tensor is prolate shape, while the yellow and white color indicates that the diffusion tensor is the oblate and spherical shape respectively. In alternative embodiments, alternative color combinations may be used.

In one embodiment, the direction method generates and displays a set of lines indicating the largest diffusion directions of all the DTI tensors, as illustrated by way of example in FIG. 4(*h*).

Fiber Track Module

In one embodiment, the computed tensors may be visualized as fiber tracks (also referenced herein as fiber bundles) via the Fiber Track Module. One embodiment allows a user to identify 2D and/or 3D region of interests (ROIs) on a reference volume, and compute the fibers passing through these ROIs. In one embodiment, the fiber tracking module is operable with the input interface providing at least 3 degrees of spatial freedom to control input, as described above. In one embodiment, as illustrated in FIG. 5, the virtual tool 502 of the input interface is used to identify a 3D ROI 504 in the displayed reference volume 506.

Figure 5:
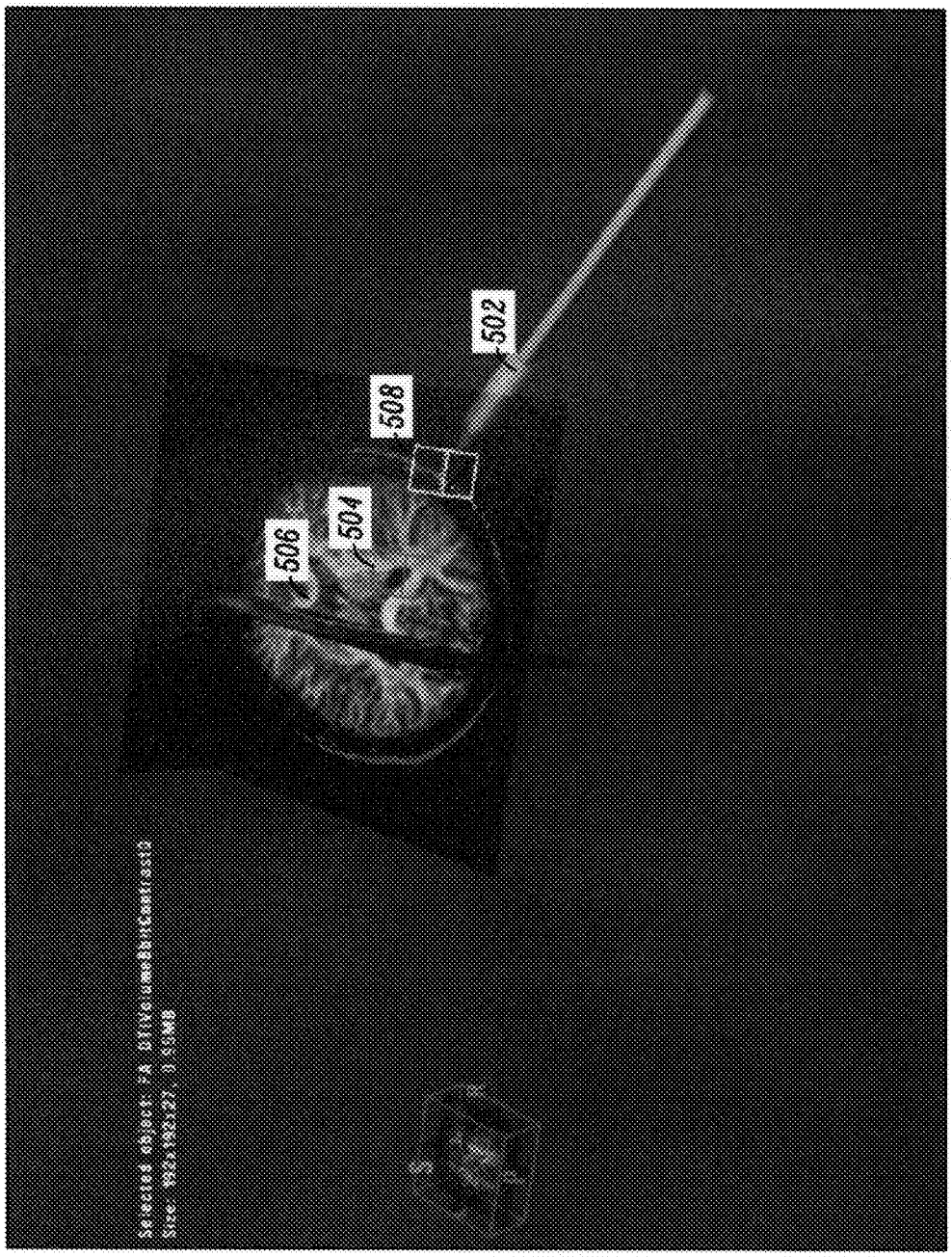
FIG. 5 illustrates identifying a 3D ROI, in accordance with one embodiment.

In one embodiment, as further illustrated in FIG. 5, to select a 3D ROI in the reference volume, a user maneuvers a 3D cube 508 at the tip of the virtual tool 502 to identify a ROI 504 in the reference volume 506. In one embodiment, after the user maneuvers the 3D cube 508 over a region of the reference volume, the user can select (e.g., pressing a button at the side of the virtual tool) the region of the reference volume as a 3D ROI 504. In response, a 3D cube remains on the reference volume 506 marking the 3D ROI 504, as illustrated in FIG. 5. Thereafter, the user can request, via the control panel, the fiber bundles passing through the 3D ROI 504 be computed/generated via the compute button 510.

In one embodiment, the fiber bundles that pass through an ROI are computed and displayed. Alternatively, the fibers for the entire volume may have already been generated but are not displayed, and therefore the fiber bundles that pass through a ROI are identified and displayed. Hence, as described herein, in one embodiment, reference to computing and/or generating fiber bundles or fiber tracks may include identifying and displaying the fiber bundles, computing and displaying the fiber bundles, or computing and not displaying the fiber bundles.

Figure 6:
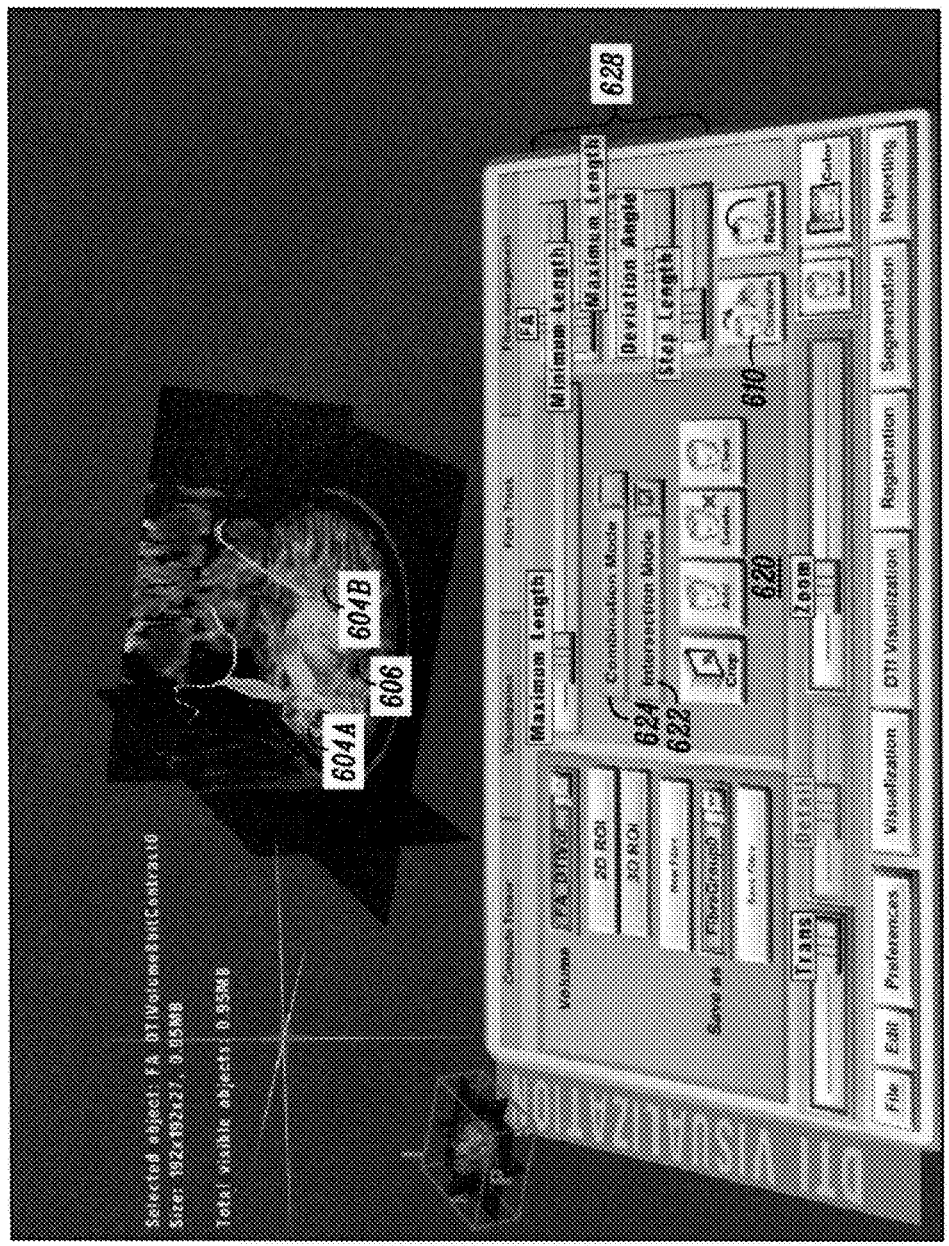
FIG. 6 illustrates identifying multiple 3D ROIs, in accordance with one embodiment.

In one embodiment, as illustrated in FIG. 6, multiple 3D ROIs 604*a-c* can be selected on the reference volume. The user can choose to generate only the fibers which pass through all the selected 3D ROIs (e.g., intersection mode 622 on the control panel 620), or choose to find all fibers passing through at least one of 3D ROIs (e.g., combination mode 624 on the panel 620.)

As further shown in FIG. 6, after a user specifies the ROI and selects the compute fiber button 610 the newly generated fiber bundles are automatically added to the active fiber group. In addition, a user can delete the newly generated fiber bundles from current active fiber group by selecting the restore button. A user can continuously delete the fiber bundles generated in different time and contained in an active fiber group by repeatedly selecting the restore button.

In one embodiment, the size of the 3D cube can be adjusted in real-time, and thereby changing the size of ROIs to be selected. The size of the 3D cube can be adjusted via an input control feature included on a control panel, or an input control feature included on a handheld device of the input interface.

In alternative embodiments, objects other than a 3D cube may be used without departing from the invention. For example, pre-set 3D regions of interest may be provided. The pre-set 3D ROIs could be defined and positioned by probabilistic methods. For example, co-registered DTI atlas information could be used to auto-detect a region which will likely contain a particular fiber track. The input interface and the DTI module, described herein, could then be used to modify the region in terms of size or shape of the pre-set 3D ROIs.

Figure 7:
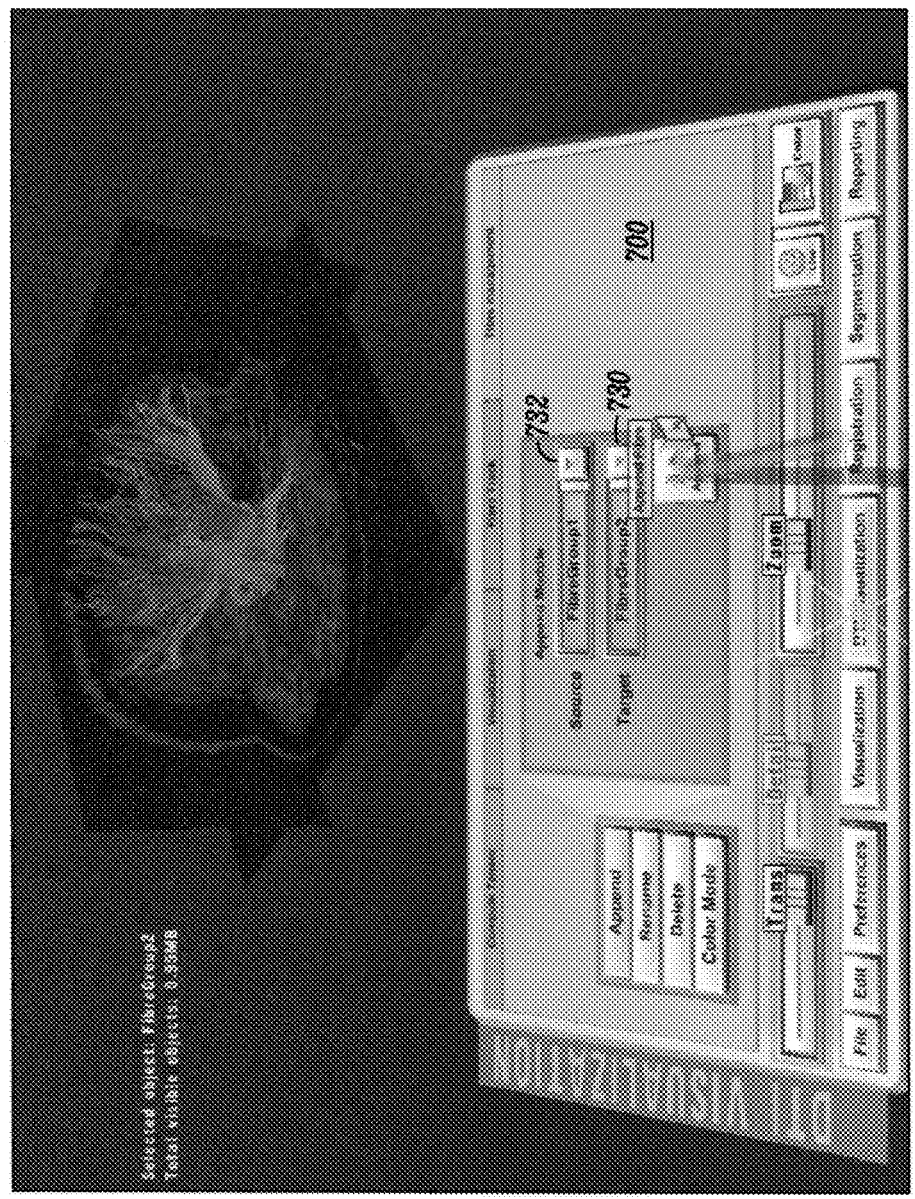
FIG. 7 illustrates adding a fiber group to a another fiber group, in accordance with one embodiment.
Figure 8:
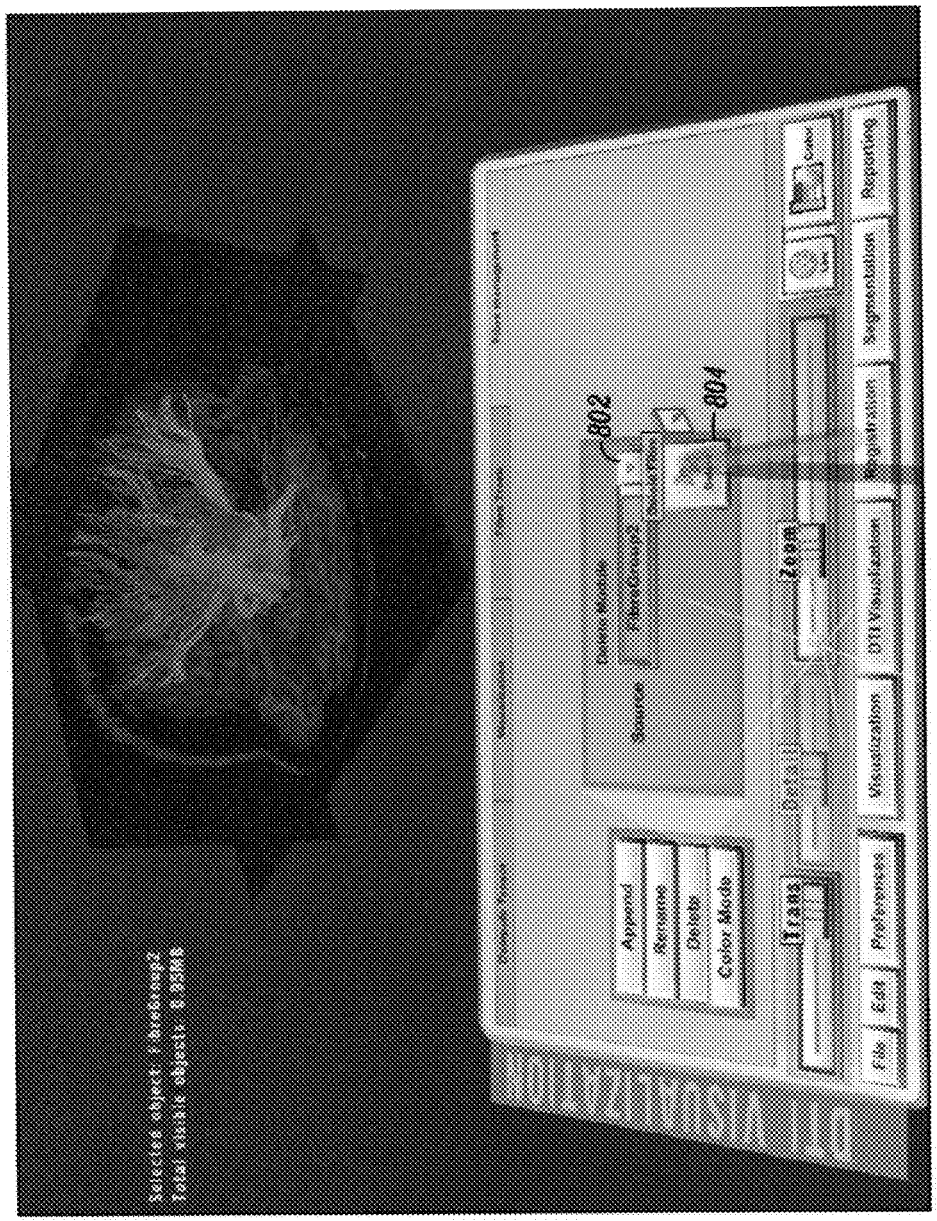
FIG. 8 illustrates deleting a fiber group, in accordance with one embodiment.

In one embodiment, as illustrated in FIG. 7, newly generated fibers group 732 is added to a second fiber group 730 via the append button 742 on the control panel of the Fiber management module 700. In one embodiment, a fiber group is the container for the fiber bundles. In one embodiment, at any time, there is one fiber group active, which is referenced as the current fiber group. As shown in FIG. 8, a first fiber group can be deleted from a set of fiber groups. In one embodiment, a user can continuously delete the fiber bundles generated in different time until the fiber group is empty.

Figure 9:
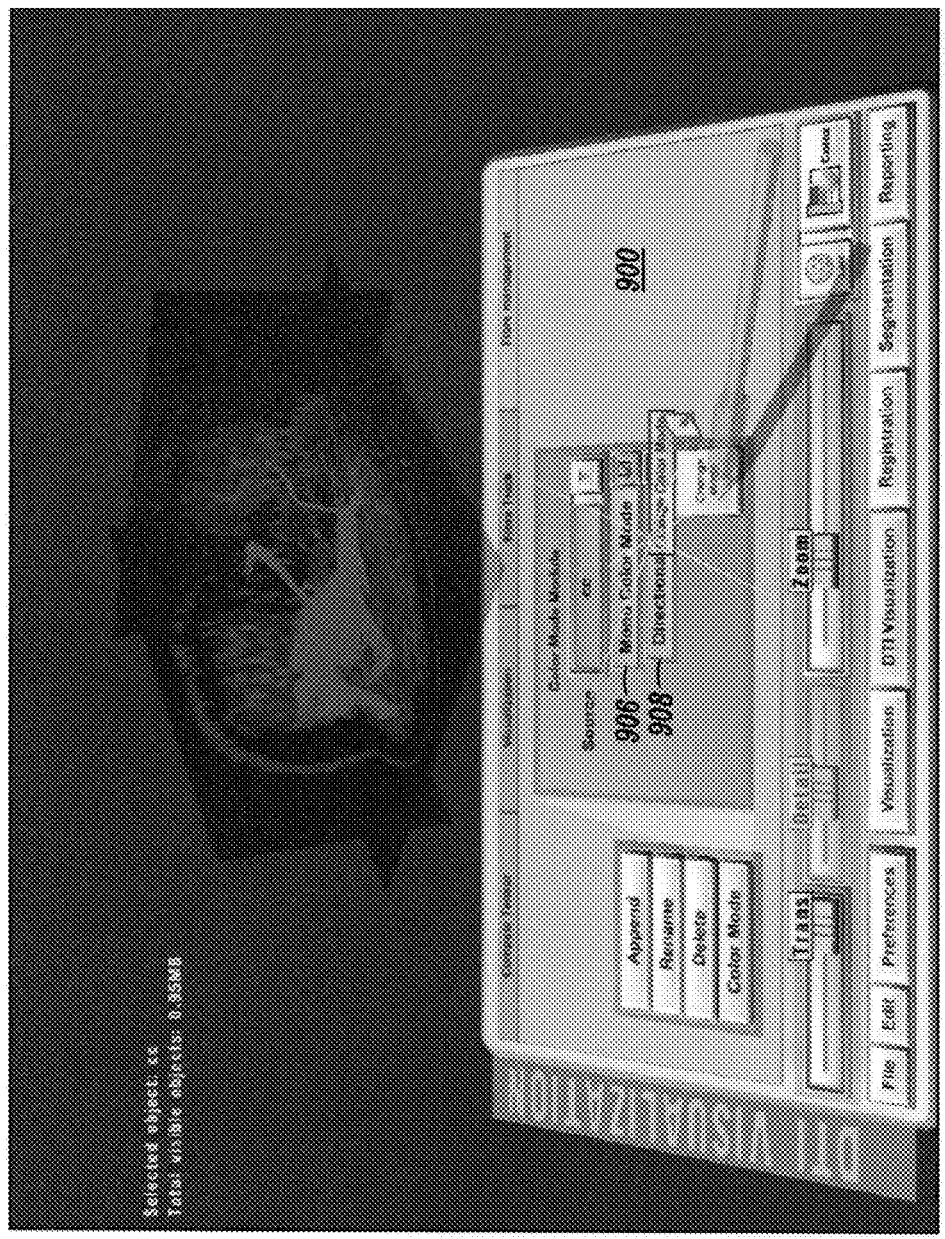
FIG. 9 illustrates renaming a fiber group and/or changing a color of a fiber group, in accordance with one embodiment.

As shown in FIG. 9, the fiber groups can also be renamed and changed to another rending color in the fiber management module. By default, the fibers in a fiber group are color-coded based on the diffusion direction information. They can also be re-colored to differentiate from other fiber groups. As an example shown in FIG. 9, there are two choices for the color of the fibers, one is the single color and the other one is the direction color.

In one embodiment, a user can also delete previously marked 3D ROIs identified with the 3D cubes placed in the reference volume. In one embodiment, a user may select the delete button 626 on the control panel 620 of the Fiber tracking module, as shown in FIG. 6. The user may then maneuver the virtual tool to approach a 3D cube added previously. When the virtual tool is within a predetermined proximity of the previously added 3D cube, the 3D cube will be highlighted. In response to a user activation (e.g., pressing a button on a side of the virtual tool,) the highlighted 3D cube will be deleted.

In one embodiment, regions within the reference volume can be identified to be avoided and not part of a ROI for generating fiber bundles. In one embodiment, an additional button can be provided in the 3D ROI interface (e.g., on the panel of the Fiber track module.) One or more cubes can be placed on the reference volume to identify a ROI that is to be avoided. In one embodiment, cubes corresponding to the ROIs to be avoided are of different color (or of different shape) relative to the cubes identifying the ROIs for generating the fiber bundles. When the user starts to compute the fibers, the fiber tracking algorithm will consider these avoid ROIs, and discard those fibers passing through the avoid ROIs.

Figure 10:
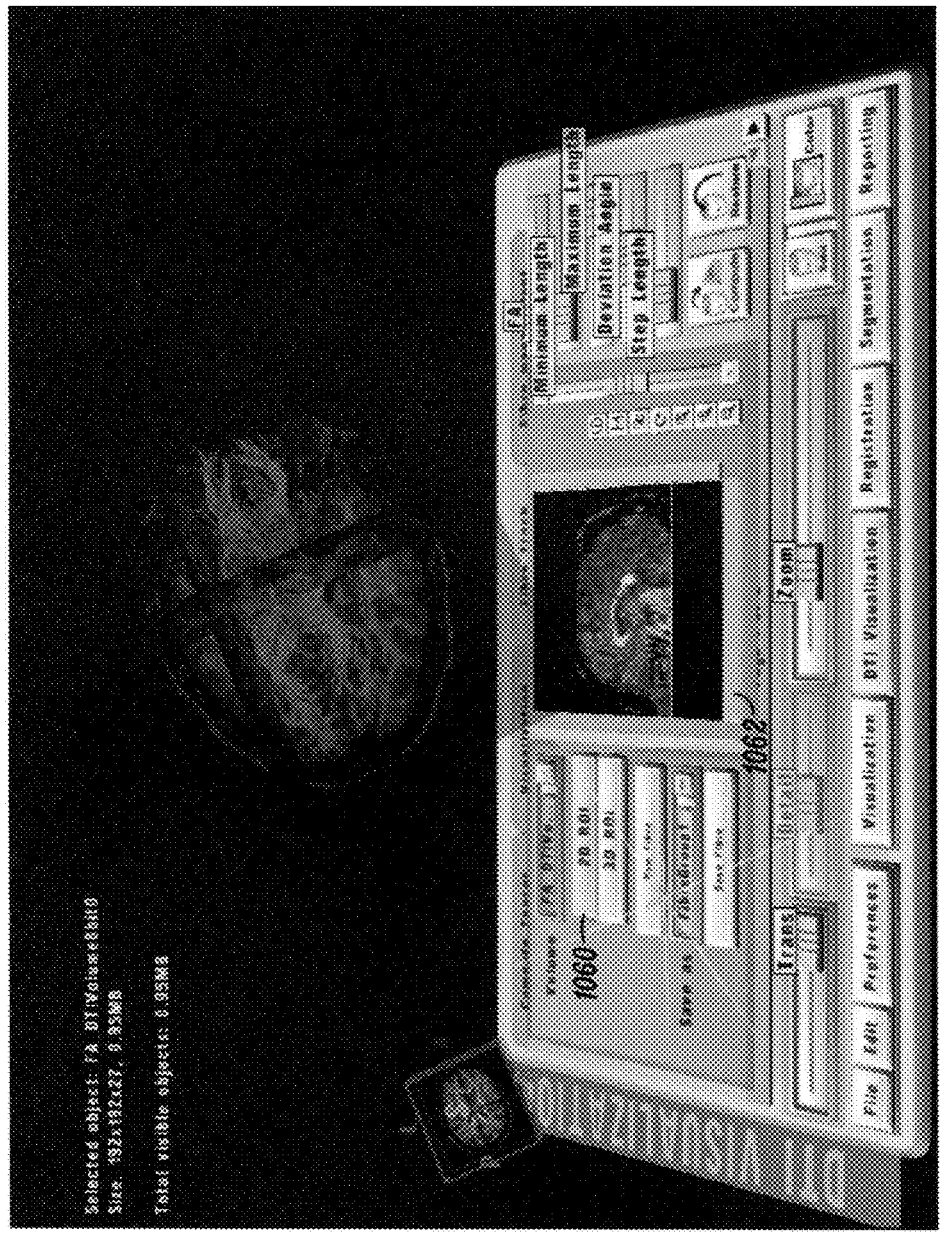
FIG. 10 illustrates identifying a 2D ROI, in accordance with one embodiment.

In one embodiment, as illustrated in FIG. 10, in response to a user selecting the 2D ROI selection button 1060, a viewer 1062 will be shown. The viewer displays a 2D slice of the reference volume and some interfaces to manipulate the slices. With the viewer, a user can choose to view the axial, sagittal and coronal slice of the reference volume, and zoom in or out the 2D slice. The user can draw a contour to specify a 2D ROI on the slice, or alternatively specify multiple 2D ROIs on the slice.

In one embodiment, the reference volume used with the fiber tracking module may be a DTI volume, or a CT, PET, SPECT, MRI, MRA, volumetric ultrasound, or the other multimodality volumes co-registered with a DTI volume. In addition, in one embodiment, a segmented image, obtained from one or more of the multimodality volumes co-registered with the DTI volumes, can be used as a reference volume.

In one embodiment, the fiber tracking panel 620 further includes an interface to adjust the stop conditions for fiber tracking. In one embodiment, the stop conditions include one or more of: FA threshold, maximum length threshold, minimum length threshold, and the deviation angle threshold. By adjusting the above thresholds, a user can obtain the fibers with different shapes and lengths. The step length slider is used to control the smoothness of the fibers. For example, if the step length is smaller, the fibers may be shown smoother and more accurate. Using these controls, a user may then find the parameters that yield the desired fiber tracking results.

Fiber Tracking

Figure 11:
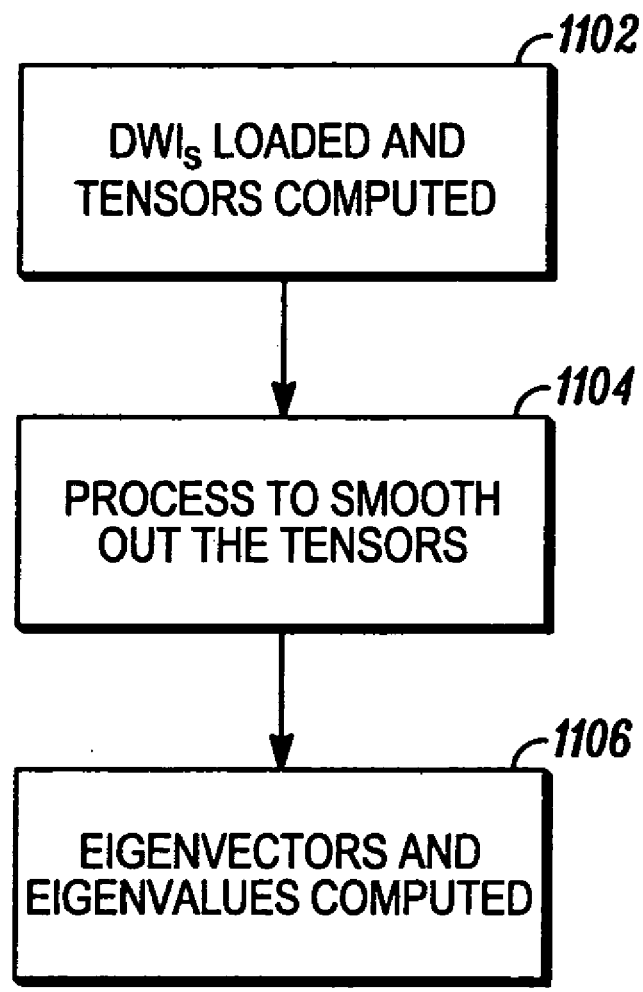
FIG. 11 presents a flow diagram describing the pre-processing for generating fiber tracks, in accordance with one embodiment.
Figure 12A:
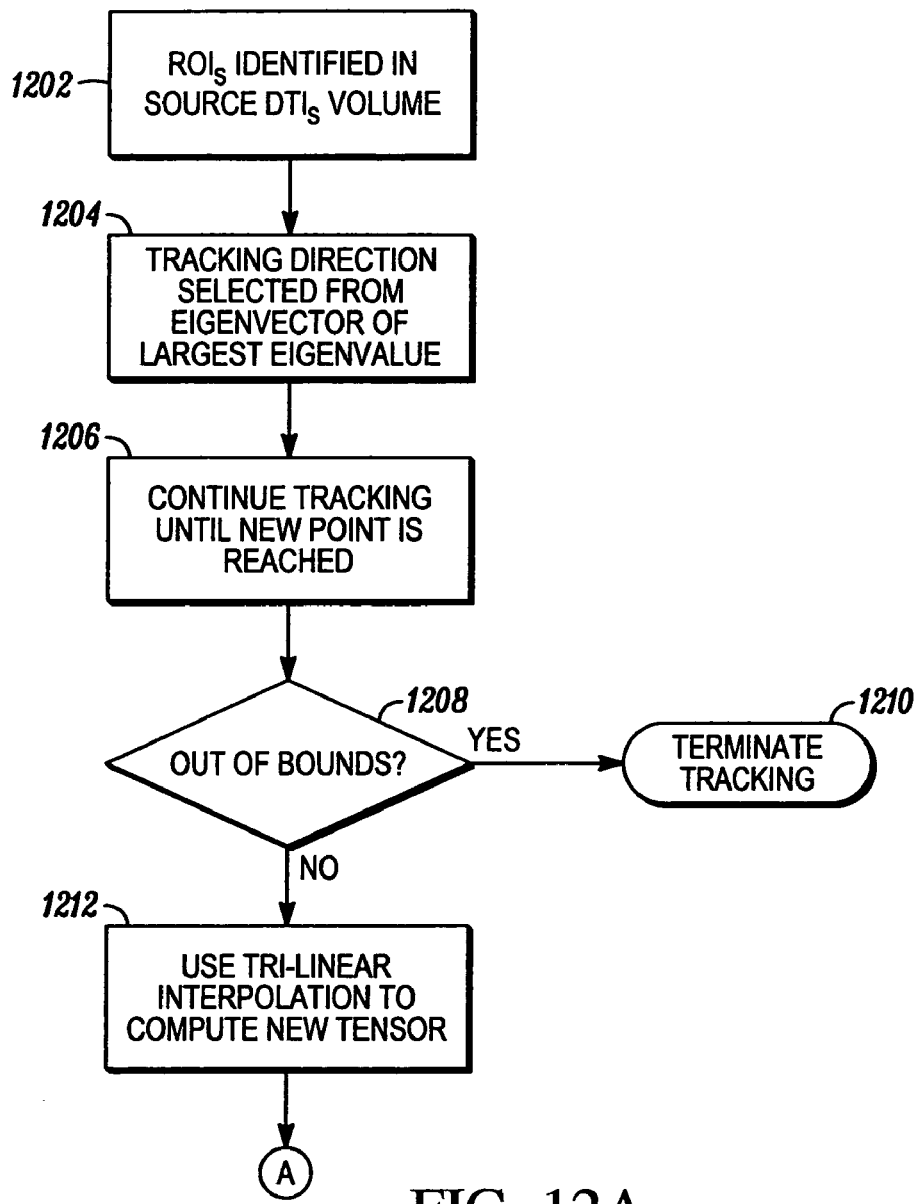
FIG. 12 presents a flow diagram describing the process of tracking to generate fiber bundles, in accordance with one embodiment.
Figure 12B:
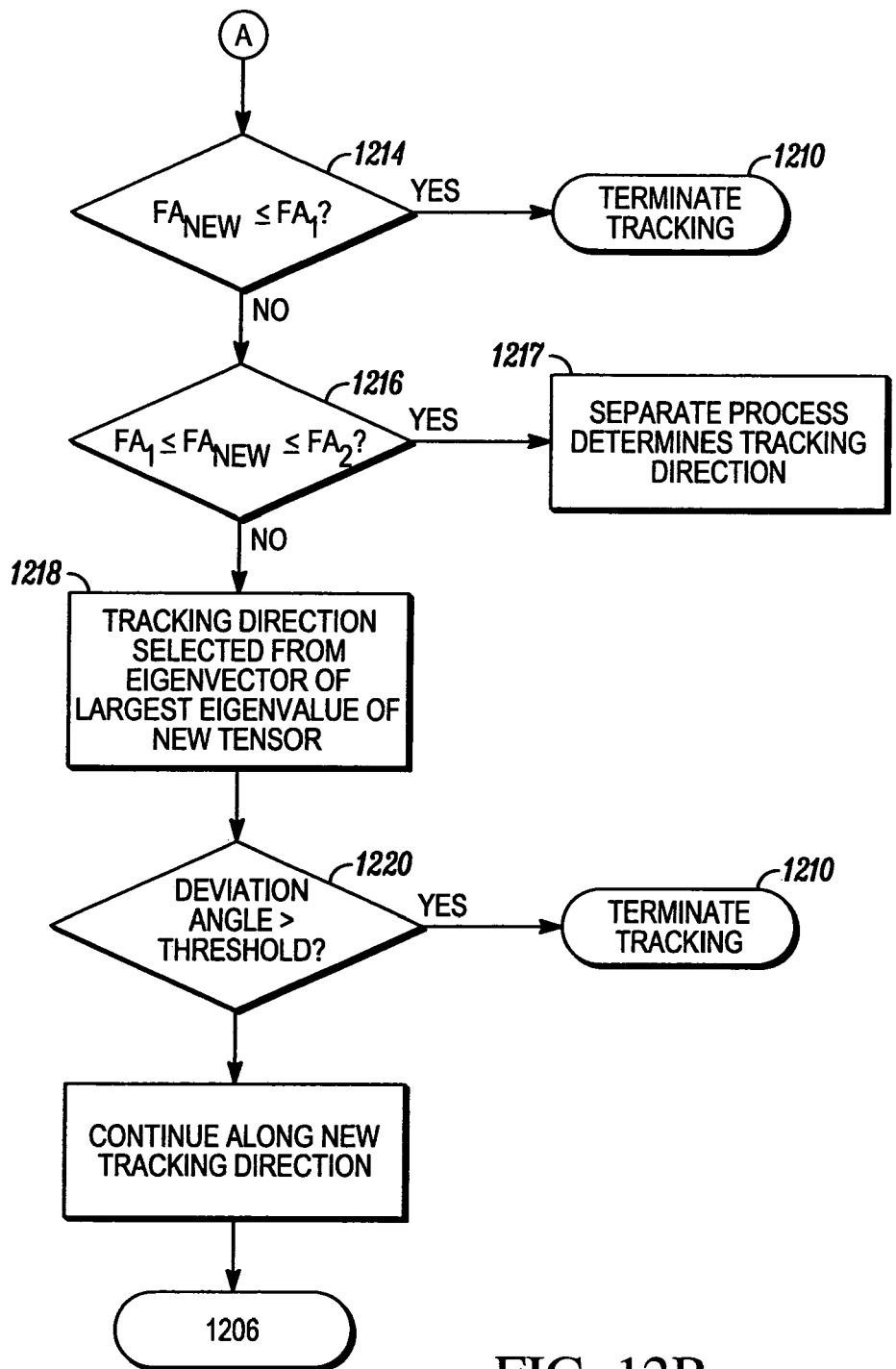

FIGS. 11 and 12 present flow diagrams describing the processes of generating and tracking the fibers, in accordance with one embodiment. FIG. 11 presents a flow diagram describing the pre-processing for generating fiber tracks. In process 1102, the Diffusion Weighted Images (DWI) (a.k.a. source DTI volume) are loaded and the tensors are computed for the voxels of the DWIs. In process 1104, a process is applied to the smooth out the tensors by reducing the noise of the data. In one embodiment, a Gaussian kernel is applied to smooth out the tensors. In alternative embodiments, alternative processes may be used without departing from the scope of the invention. In process 1106, the eigenvectors and eigenvalues are computed for the tensors.

FIG. 12 presents a flow diagram describing the process of tracking to generate the fiber bundles, in accordance with one embodiment. In process 1202, one or more ROIs are identified within a reference volume, as previously described. For example, multiple ROIs can be selected, and/or the ROIs can be selected as 3D ROIs. Furthermore, in one embodiment, a set of ROIs can be selected so that the result fiber passes through all of the selected ROIs (i.e., intersection mode.)

In process 1204, the eigenvector corresponding to the largest eigenvalue is identified for the tensors of the voxels in a ROI. Tracking of the respective fiber proceeds along the direction of this eigenvector.

In process 1206, tracking continues along the current tracking direction for a short distance and a new point is reached. In one embodiment, the short distance is referenced as the step length and can be a fixed value or an adaptive value. If the step length is fixed, then the step length is fixed to some value. In one embodiment, the user can adjust the value by adjusting the step length slider previously described. If the step length is adaptive, then the distance changes during the fiber tracking process according to an anisotropy value of the tensor on the previous point.

In process 1208, if the new point is out of bounds relative to the source DTI volume, the tracking is terminated 1210. In particular, in one embodiment, the reference volume has a bounding box that indicates the size of the source DTI volume. If the new point is outside of this bounding box, the tracking is out of bound and the tracking is terminated. Otherwise, in process 1212, a tri-linear interpolation process is used to compute a new tensor at the new point, and the eigenvectors and eigenvalues are computed for the new tensor.

In process 1214, if the Fractional Anisotropy ($FA_{new}$) value of the new tensor is less than the $FA_1$ (i.e., a predefined threshold), the tracking is terminated 1210. In process 1216, if $FA_{new}$ is between $FA_1$ and $FA_2$ ($FA_2$ is a predefined thresholds with $FA_2 > FA_1$), a separate process is used to generate the next candidate tracking direction. Otherwise, in process 1218 tracking of the respective fiber proceeds along the direction of the eigenvector corresponding to the largest eigenvalue for the new tensor. In alternative embodiments, measurements other than FA can be used without departing from the invention.

In process 1220, if a deviation angle between the current track direction and next candidate tracking direction is larger than a predefined threshold, the tracking is terminated 1210. Otherwise, in process 1222 the fiber tracking continues along the next tracking direction and the process continues again at process 1206. In one embodiment, the processes 1202-1222 are performed for a set of the voxels identified with an identified ROI. In alternative embodiments, some of the processes described can be excluded, as well as additional processes included, without departing from the scope of the invention.

Figure 13:
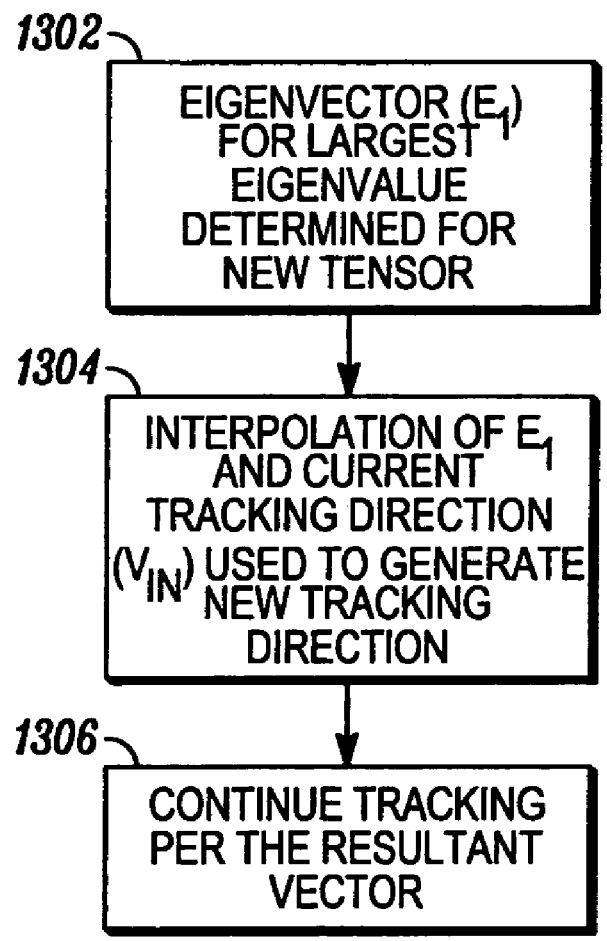
FIG. 13 presents a flow diagram describing the processes of generating a tracking direction, in accordance with one embodiment.

FIG. 13 presents one embodiment of a flow diagram describing the processes of generating a tracking direction when, the $FA_{new}$ is between $FA_1$ and $FA_2$, as referenced in process 1216. In process 1302, the eigenvector $e_l$ corresponding to the largest eigenvalue for the new tensor is determined. In process 1304, an interpolation using the eigenvector ($e_l$) determined in process 1302 and the current tracking direction ($v_{in}$), is used to generate the next tracking direction. In one embodiment, the interpolation comprises a linear interpolation of: vector $(v) = (1-w)* v_{in} + w* e_l$, where w is the weight for the interpolation. In process 1306, the result vector (v) is assigned as the next tracking direction. In alternative embodiments, variations of the interpolation may be used to determine the tracking direction without departing from the scope of the invention.

In one embodiment, the weight (w) used for the linear interpolation is a function of $FA_{new}$ wherein $FA_{new} = f(w)$. In one embodiment, when $FA_{new}$ is smaller, the weight (w) is also smaller and vice versa.

Furthermore, in one embodiment variations of the weight are moderated relative to variations in the FA value. In one embodiment, to moderate the variations of the weight, a second order parabola (f) is used, which is defined as $(f) = a*w*w + b*w + c$. The coefficients a, b, c, in one embodiment, are determined based on using predefined correspondences of the FA value and the weight. In alternative embodiments, variations of determining the weight for the interpolation may be used without departing from the scope of the invention.

CONCLUSION

It is clear that many modifications and variations of this embodiment may be made by one skilled in the art without departing from the spirit of the novel art of this disclosure.

The processes described above can be stored in a memory of a computer system as a set of instructions to be executed. In addition, the instructions to perform the processes described above could alternatively be stored on other forms of machine-readable media, including magnetic and optical disks. For example, the processes described could be stored on machine-readable media, such as magnetic disks or optical disks, which are accessible via a disk drive (or computer-readable medium drive). Further, the instructions can be downloaded into a computing device over a data network in a form of compiled and linked version.

Alternatively, the logic to perform the processes as discussed above could be implemented in additional computer and/or machine readable media, such as discrete hardware components as large-scale integrated circuits (LSI's), application-specific integrated circuits (ASIC's), firmware such as electrically erasable programmable read-only memory (EEPROM's); and electrical, optical, acoustical and other forms of propagated signals (e.g., carrier waves, infrared signals, digital signals, etc.); etc.

It is clear that many modifications and variations of this embodiment may be made by one skilled in the art without departing from the spirit of the novel art of this disclosure.

What is claimed is:

1. A method comprising:
   selecting a direction of tracking a fiber based on a first vector corresponding to a largest value of a set of values for a first tensor, if an anisotropy value of the tensor is greater than or equal to a first threshold; and
   if the anisotropy value of the first tensor is less than or equal to the first threshold and larger than or equal to a second threshold, applying a weighted function to the vector of the first tensor to select the direction of tracking the fiber.

2. The method of claim 1, wherein the vector is an eigenvector and the largest value and set of values are eigenvalues for the first tensor.

3. The method of claim 1, wherein applying the weighted function to the vector further comprises applying a linear interpolation to the vector.

4. The method of claim 3, wherein the linear interpolation is based at least in part on a prior vector.

5. The method of claim 4, wherein a weight of the linear interpolation is based at least in part on the anisotropy value of the first tensor.

6. The method of claim 5, further comprising terminating the tracking of the fiber if the anisotropy value of the first tensor is less than or equal to a second threshold, the second threshold being less than the first threshold.

7. The method of claim 5, further comprising applying a filter to the first tensor prior to computing vectors and values of the first tensor.

8. The method of claim 7, wherein the filter comprises a Gaussian function.

9. The method of claim 6, further comprising, after tracking a predetermined distance, performing a tri-linear interpolation to generate a second tensor; and
   determining a next direction of tracking the fiber based on a vector corresponding to a largest value of a set of values for the second tensor, if an anisotropy value of the second tensor is greater than or equal to the first threshold; and
   if the anisotropy value of the second tensor is less than or equal to the first threshold and larger than or equal to the second threshold, applying the weighted function to the vector of the second tensor, to select the direction of tracking the fiber.

10. The method of claim 5, wherein the weight of the linear interpolation is in part computed via a second order parabola function.

11. The method of claim 5, wherein the anisotropy value is a fractional anisotropy (FA) value.

12. The method of claim 5, wherein weight corresponds to the anisotropy value relative to the first threshold and second threshold.

13. A method comprising:
    determining a direction of tracking a fiber based on a vector corresponding to a largest value of a set of values for a tensor of a voxel, if an anisotropy value of the tensor is greater than or equal to a first threshold; and
    determining the direction of tracking the fiber based at least in part on a combination of the vector and a prior tracking direction, if the anisotropy value of the tensor is less than the first threshold.

14. A machine-readable medium, the medium being selected from the group consisting of a magnetic disk, an optical disk and a discrete hardware component, the medium having stored thereon a set of instructions, which when executed perform a method comprising:
    determining a direction of tracking a fiber based on a vector corresponding to a largest value of a set of values for a first tensor, if an anisotropy value of the tensor is greater than or equal to a first threshold; and
    if the anisotropy value of the first tensor is less than or equal to the first threshold and larger than or equal to the second threshold, applying a weighted function to the vector of the first tensor to select the direction of tracking the fiber.

15. The machine-readable medium of claim 14 wherein applying the weighted function to the vector further comprises applying a linear interpolation to the vector of the first tensor.

16. The machine-readable medium of claim 14 wherein the method further comprises:
    after tracking a predetermined distance, performing a trilinear interpolation to generate a second tensor; and
    determining a next direction of tracking the fiber based on a vector corresponding to a largest value of a set of values for the second tensor, if an anisotropy value of the second tensor is greater than or equal to the first threshold; and
    if the anisotropy value of the second tensor is less than or equal to the first threshold and larger than or equal to the second threshold, applying the weighted function to the vector of the second tensor, to select the direction of tracking the fiber.

17. The machine-readable medium of claim 15, wherein a weight of the linear interpolation is in part dependent on the anisotropy value of the first tensor.

18. A system comprising:
    a means for determining a direction of tracking a fiber based on a vector corresponding to a largest value of a set of values for a tensor, if an anisotropy value of the tensor is greater than or equal to a first threshold; and
    a means for applying a weighted function to the vector of the tensor to select the direction of tracking the fiber, if the anisotropy value of the tensor is less than or equal to the first threshold and larger than or equal to a second threshold.

19. A system comprising:

a unit to determine a direction of tracking a fiber based on a vector corresponding to a largest value of a set of values for a tensor, if an anisotropy value of the tensor is greater than or equal to a first threshold; and a unit to apply a weighted function to the vector of the tensor to select the direction of tracking the fiber, if the anisotropy value of the tensor is less than or equal to the first threshold and larger than or equal to a second threshold.

20. The system of claim 19, wherein the unit to apply the weighted function to the vector is to apply a linear interpolation to the vector of the tensor.

* * * * *